(12) United States Patent
Marr et al.

(10) Patent No.: US 10,181,862 B1
(45) Date of Patent: Jan. 15, 2019

(54) PARAMETERIZABLE BANDPASS DELTA-SIGMA MODULATOR

(71) Applicant: RAYTHEON COMPANY, Waltham, MA (US)

(72) Inventors: Harry B. Marr, Manhattan Beach, CA (US); Daniel Thompson, Hermosa Beach, CA (US); Mark B. Yeary, Krum, TX (US)

(73) Assignee: RAYTHEON COMPANY, Waltham, MA (US)

(*) Notice: Subject to any disclaimer, the term of this patent is extended or adjusted under 35 U.S.C. 154(b) by 0 days.

(21) Appl. No.: 15/879,024

(22) Filed: Jan. 24, 2018

(51) Int. Cl.
*H03M 3/00* (2006.01)
*H04B 1/00* (2006.01)
(Continued)

(52) U.S. Cl.
CPC ............ *H03M 3/404* (2013.01); *H03M 3/324* (2013.01); *H03M 3/464* (2013.01); *H04B 1/0017* (2013.01); *H04B 1/04* (2013.01); *H04B 7/0617* (2013.01); *H03H 17/0294* (2013.01); *H04B 2001/0491* (2013.01)

(58) Field of Classification Search
CPC ............... H03F 1/3247; H03F 1/3294; H03F 2201/3233; H04L 27/368; H04L 25/03343; H04L 25/03038; H04L 27/2647; H04L 2025/03414; H04L 25/03057; H04B 1/1036; H03M 3/30; H03M 3/43; H03M 3/454; H03M 7/304; H03M 7/3028; H03M 3/342; H03M 3/414; H03M 3/416; H03M 3/418; H03M 1/0668; H03M 7/3015

USPC ........ 375/242–254, 259, 285, 295–296, 316, 375/346–351, 354–355
See application file for complete search history.

(56) References Cited

U.S. PATENT DOCUMENTS

| | | | |
|---|---|---|---|
| 5,392,040 A | * | 2/1995 | Hayashi ............ H03M 7/3015 341/143 |
| 5,598,158 A | * | 1/1997 | Linz ........................ G06F 3/16 341/143 |

(Continued)

OTHER PUBLICATIONS

Cordeiro et al., "Agile All-Digital RF Transceiver Implemented in FPGA," IEEE Xplore, Nov. 11, 2017, IEEE Transactions on Microwave Theory and Techniques, vol. 65, pp. 4229-4240.
(Continued)

*Primary Examiner* — James M Perez
(74) *Attorney, Agent, or Firm* — Lewis Roca Rothgerber Christie LLP

(57) ABSTRACT

A delta-sigma modulator (DSM) includes: a first summation circuit coupled to an input signal for subtracting an error feedback signal from the input signal; a tunable signal transfer function coupled to the first summation circuit for setting a desired pole in a frequency response of the DSM; a second summation circuit coupled to the tunable signal transfer function for adding a noise transfer function to an output of the tunable signal transfer function; and a quantizer coupled to the second summation circuit for quantizing an output of the second summation circuit to generate an output of the DSM. The output of the DSM is used as feedback to the first summation circuit as the error feedback signal, and the tunable signal transfer function is dynamically tuned to allow selecting and tuning a center frequency and a bandwidth of the DSM.

17 Claims, 6 Drawing Sheets

(51) Int. Cl.
*H04B 7/06* (2006.01)
*H04B 1/04* (2006.01)
*H03H 17/02* (2006.01)

(56) References Cited

U.S. PATENT DOCUMENTS

| | | | | |
|---|---|---|---|---|
| 5,736,950 A * | 4/1998 | Harris | | H03M 7/3017 |
| | | | | 341/143 |
| 6,225,928 B1 * | 5/2001 | Green | | H03M 3/40 |
| | | | | 341/143 |
| 6,329,939 B1 * | 12/2001 | Swaminathan | | H03M 3/326 |
| | | | | 327/58 |
| 6,396,428 B1 * | 5/2002 | Cheng | | H03M 3/37 |
| | | | | 341/143 |
| 6,414,615 B1 * | 7/2002 | Cheng | | H03M 3/37 |
| | | | | 341/143 |
| 6,492,925 B2 * | 12/2002 | Drentea | | H03M 3/396 |
| | | | | 341/143 |
| 6,693,573 B1 * | 2/2004 | Linder | | H03M 3/408 |
| | | | | 341/143 |
| 6,738,003 B2 * | 5/2004 | Melanson | | H03M 7/3006 |
| | | | | 341/143 |
| 6,774,832 B1 * | 8/2004 | Essenwanger | | G06F 1/0321 |
| | | | | 341/143 |
| 6,867,720 B1 * | 3/2005 | Freeman | | G01S 7/52028 |
| | | | | 341/143 |
| 7,110,460 B1 * | 9/2006 | Melanson | | H03M 7/304 |
| | | | | 341/143 |
| 7,180,432 B2 * | 2/2007 | Oliaei | | H03M 3/40 |
| | | | | 341/143 |
| 7,715,490 B2 * | 5/2010 | Rezeq | | H03M 7/3022 |
| | | | | 331/16 |
| 7,817,725 B2 * | 10/2010 | Matsuura | | H03M 3/368 |
| | | | | 375/245 |
| 7,912,145 B2 * | 3/2011 | Yellin | | H03C 3/0925 |
| | | | | 375/295 |
| 7,928,876 B2 * | 4/2011 | Thomsen | | H03M 3/484 |
| | | | | 341/143 |
| 7,956,781 B2 * | 6/2011 | Oliaei | | H03M 3/392 |
| | | | | 341/143 |
| 8,130,128 B2 * | 3/2012 | Alderson | | G06F 1/02 |
| | | | | 341/152 |
| 8,233,412 B1 * | 7/2012 | Abbey | | H04B 1/001 |
| | | | | 370/210 |
| 8,411,788 B2 * | 4/2013 | Sahota | | H03C 5/00 |
| | | | | 327/147 |
| 8,736,475 B1 * | 5/2014 | Harrison | | H03M 3/504 |
| | | | | 341/143 |
| 9,490,798 B1 * | 11/2016 | Charpentier | | H03K 17/04206 |
| 9,577,663 B1 * | 2/2017 | Paton Alvarez | | H03M 3/464 |
| 9,628,164 B1 * | 4/2017 | Thompson | | H04B 7/0667 |
| 9,787,319 B2 * | 10/2017 | Nakanishi | | H03M 3/30 |
| 9,866,238 B1 * | 1/2018 | Thomsen | | H03M 3/462 |
| 9,917,570 B2 * | 3/2018 | Nikitin | | H03H 7/0153 |
| 9,942,682 B2 * | 4/2018 | Ma | | H03M 3/04 |
| 9,948,318 B1 * | 4/2018 | Tsai | | H03M 3/322 |
| 2003/0080887 A1 * | 5/2003 | Havelock | | G10K 11/346 |
| | | | | 341/143 |
| 2009/0066549 A1 * | 3/2009 | Thomsen | | H03M 3/482 |
| | | | | 341/143 |
| 2009/0243591 A1 * | 10/2009 | Melanson | | G01R 21/1331 |
| | | | | 324/120 |
| 2011/0065409 A1 * | 3/2011 | Kenington | | H04B 1/126 |
| | | | | 455/307 |
| 2011/0150130 A1 * | 6/2011 | Kenington | | H03F 1/3247 |
| | | | | 375/296 |
| 2011/0151806 A1 * | 6/2011 | Kenington | | H01Q 3/28 |
| | | | | 455/101 |
| 2011/0287728 A1 * | 11/2011 | Kenington | | H04B 17/21 |
| | | | | 455/226.1 |
| 2012/0237060 A1 * | 9/2012 | Cho | | H03F 3/217 |
| | | | | 381/121 |
| 2012/0288035 A1 * | 11/2012 | Karthaus | | H03M 3/508 |
| | | | | 375/340 |
| 2013/0028448 A1 * | 1/2013 | Choi | | H03F 3/217 |
| | | | | 381/120 |
| 2014/0077983 A1 * | 3/2014 | Podsiadlik | | H03F 3/2175 |
| | | | | 341/143 |
| 2014/0368368 A1 * | 12/2014 | Koli | | H03M 3/462 |
| | | | | 341/143 |
| 2015/0171886 A1 * | 6/2015 | Kinyua | | H03M 1/747 |
| | | | | 375/238 |
| 2015/0288379 A1 * | 10/2015 | Silva | | H03M 3/352 |
| | | | | 341/118 |
| 2016/0013805 A1 * | 1/2016 | Maehata | | H03M 3/422 |
| | | | | 341/143 |
| 2016/0065236 A1 * | 3/2016 | Ahmed | | G05F 3/02 |
| | | | | 341/143 |
| 2016/0072521 A1 * | 3/2016 | Melanson | | H03M 3/44 |
| | | | | 341/143 |
| 2016/0322982 A1 * | 11/2016 | Pagnanelli | | H03M 1/0626 |
| 2016/0359499 A1 * | 12/2016 | Bandyopadhyay | | H03M 3/30 |
| 2017/0163301 A1 * | 6/2017 | Gupta | | H04B 1/109 |
| 2017/0179969 A1 * | 6/2017 | Meng | | H03M 1/08 |
| 2017/0180026 A1 * | 6/2017 | Flynn | | H04B 7/0617 |
| 2017/0353191 A1 * | 12/2017 | Weng | | H03M 3/326 |
| 2017/0360400 A1 * | 12/2017 | Kaald | | A61B 8/4494 |
| 2018/0132750 A1 * | 5/2018 | Kalb | | H03M 3/414 |

OTHER PUBLICATIONS

Tanio et al., "An FPGA-based All-Digital Transmitter with 9.6-GHz 2nd order Time-Interleaved Delta-Sigma Modulation for 500-MHz bandwidth," IEEE, 2017, 4 pages.

Dinis et al., "All-Digital Transmitter based on Cascaded Delta-Sigma Modulators for Relaxing the Analog Filtering Requirements," IEEE, 2017, 4 pages.

* cited by examiner

FIG. 1     (Prior Art)

PARAMETERIZABLE BANDPASS DELTA-SIGMA MODULATOR

FIELD OF THE INVENTION

The present invention relates generally to digital signal generation and more specifically to a parameterizable bandpass delta-sigma modulator for direct digital RF signal generation.

BACKGROUND

High resolution arbitrary waveform generators (AWGs) are employed in electronic applications to provide arbitrary high frequency waveforms. Agile high resolution arbitrary waveform generators deliver fast switching of arbitrary waveforms. One way to implement a high frequency is to use a Direct Digital Synthesis (DDS) for creating arbitrary waveforms from a single, fixed-frequency reference clock. A more common implementation for an AWG is where a memory filled with waveform parameters is directly routed to a digital-to-analog converter (DAC). This direct memory approach, which bypasses the DDS, allows for much more complex waveforms to be implemented, such as those that involve feedback where the value of waveform samples depend on prior waveform samples. The feedback loop or any other formulation for the waveform samples are computed in non-real time, such as on a computer, and then loaded into the memory of the AWG device.

FIG. 1 illustrates an exemplary conventional waveform generation circuit that includes an input signal 102, a phase accumulator 108, a waveform look-up table 106, a reference clock 110, a digital-to-analog converter (DAC) 112 and a filter 114. The phase accumulator and the waveform look-up table form a DDS circuit 104 for producing a high frequency digital signal that is converted to a high frequency analog signal by the DAC 112. The waveform look-up table is programmable by storing binary data for every combination of input data provided by the phase accumulator 108. The DDS output waveform is then written to the look-up table 106. In a DDS bypass mode, the look-up table memory 106 stores the computed waveform values and the values are streamed directly to the DAC. In this mode, the input from the phase accumulator 108 is disabled.

Delta-sigma modulation is a method for encoding analog signals into digital signals, for example, in an analog-to-digital converter (ADC). This modulation scheme is also used to convert high bit-count, low-frequency digital signals into lower bit-count, higher-frequency digital signals as part of a process to convert digital signals into analog, for example, in a DAC. In delta modulation stage of a delta-sigma modulation, the change in the signal (i.e., delta) is encoded (instead of the absolute value). The output is a stream of pulses, as opposed to a stream of numbers in pulse code modulation (PCM). In delta-sigma modulation, the accuracy of the modulation is improved by passing the digital output through a 1-bit DAC and adding (i.e., sigma) the resulting analog signal to the input signal before delta modulation to reduce the error introduced by the delta-modulation.

A delta-sigma ADC typically encodes an analog signal using high-frequency delta-sigma modulation, and then applies a digital filter to form a higher-resolution but lower sample-frequency digital output. A delta-sigma DAC encodes a high-resolution digital input signal into a lower-resolution but higher sample-frequency signal and then smoothen it with an analog filter. In both cases, the temporary use of a lower-resolution signal simplifies circuit design and improves efficiency.

FIG. 2 illustrates a typical delta-sigma modulator. As shown, the delta-sigma modulator comprises a feedback 1-bit DAC 216, a loop transfer function (i.e., frequency response of output signal 215/input signal 202) that acts as a filter and is made up of a delay implemented in the feedback DAC 216, delay or gain implemented in the feedback lines 217 and 203 and a quantizer 212. This way, an input signal 202 is quantized by the quantizer 212, resulting in some quantization error. This quantization error is then fed back and subtracted from the input signal 202 to correct the quantization error. After the quantizer 212, the quantization error is fed back through signal line 215. In a receive mode of the system where the input signal 202 is analog and the quantizer converts the analog signal to a digital signal, the feedback continues through the DAC 216 to be fed back through signal lines 217, 209 and 203.

The order of the filter is set to be the number of feedback loop paths in the summation block. In general, the higher the order of the delta-sigma modulator, the more quantization error can be removed and thus the higher the final dynamic range. However, a higher order filter results in more circuit complexity (e.g., more feedback loops). FIG. 2 depicts two feedback loops comprising signal path 217 to signal path 209 and into a summation circuit 208, and signal path 217 to signal path 203 and into the summation circuit 204. The input 202 to the modulator goes through several integrators 206 and 210 and summation circuits 204 and 208. These integrators 206 and 210 serve to integrate or sum successive values of the input signal 202. The integration time is one of the key parameters that define the modulator performance. Longer integration times result in larger gain, but also can result in lower sensitivity to error.

The integrators 206 and 210 often serve to create an average value from the input signal 202. A longer integration time in integrators 206 and 210 are effective in, for example, dampening out very high frequency oscillations that are undesirable. The summation blocks 204 and 208 serve to subtract out error that is relayed through the feedback loop. A (digital) filter 214 is used to perform post processing on the quantized signal, and the output of the digital filter 214 represents the output of the delta-sigma modulator. Typical filtering operations include digital down conversion and low pass filtering to decimate the signal to a lower sampling rate.

In some cases, the input signal 202 is a digital signal and the quantizer 212 converts the digital input to an analog signal. In these cases, the filter 214 would be an analog filter and the feedback can be performed digitally so the DAC 216 would not be required.

A single-bit delta-sigma modulator is popular primarily because of the inherent linearity of a single-bit feedback DAC. On the other hand, a single-bit quantizer makes the delta-sigma modulator a non-linear system. The single-bit delta-sigma modulator consequently produces very large tones near the half of a sampling frequency, also referred to as idle tones, as a result of limited cycles. The idle tones are particularly relevant, if another signal near the half of the sampling frequency interferes with a bit stream of the delta-sigma modulator. In this case, a tone gets folded down, for example, in the baseband.

A phase lock loop (PLL) is used in a reference clock generator, such as the reference clock 110 in FIG. 1, to generate an output signal, the phase of which is related to the phase of the input signal 102. A typical PLL includes a variable frequency oscillator and a phase detector in a feedback loop. The oscillator generates a periodic signal, and the phase detector compares the phase of that signal with the phase of the input periodic signal, adjusting the oscillator to keep the phases matched. In addition to synchronizing signals, a PLL can track an input frequency, or it can generate an output signal with a frequency that is a multiple of the input signal frequency, which are used for clock synchronization, signal demodulation, and frequency synthesis.

In a direct radio frequency (RF) signal conversion, the conversion of the modulated signal to a baseband signal is performed in a single frequency conversion. This avoids the complexity of the superheterodyne that performs two (or more) frequency conversions, intermediate frequency (IF) stage(s). In the direct RF signal conversion, the received RF signal is fed directly into a frequency mixer, where the frequency of the local oscillator is not offset from, but identical to, the received signal's frequency. The result is a demodulated output similar to output of a superheterodyne receiver using synchronous detection following an IF stage. However, direct RF conversion is expensive for arbitrary frequencies and bandwidths.

Prior approaches use a variable sampling frequency, which requires resetting the PLL also known as the reference clock in the circuit, such as resetting the reference clock 110 shown in FIG. 1, which inhibits real-time updates and thus diminishes real-time performance. Another prior approach for an RF application for Long Term Evolution (LTE) signals relies on a fixed sampling frequency (Fs) to produce a bandpass signal at Fs/4. However, this approach is not frequency agile in software.

Therefore, there is a need for a frequency agile waveform generator whose coefficients are software defined to provide a variable approach in software for generating the parameters (e.g., passband frequency, bandwidth, etc.) in real-time.

SUMMARY

In some embodiments, the disclosed invention is a parameterizable bandpass delta-sigma modulator (DSM). The DSM includes: a first summation circuit coupled to an input signal for subtracting an error feedback signal from the input signal; a tunable signal transfer function coupled to the first summation circuit for setting a desired pole in a frequency response of the DSM; a second summation circuit coupled to the tunable signal transfer function for adding a noise transfer function to an output of the tunable signal transfer function; and a quantizer coupled to the second summation circuit for quantizing an output of the second summation circuit to generate an output of the DSM, wherein the output of the DSM is used as feedback to the first summation circuit as the error feedback signal, and wherein the tunable signal transfer function is dynamically tuned to allow selecting and tuning a center frequency and a bandwidth of the DSM.

In some embodiments, the disclosed invention is a method for tuning a DSM. The method includes: receiving an input signal; subtracting an error feedback signal from the input signal; setting a desired pole in a tunable signal transfer function of the DSM; adding a noise transfer function to an output of the tunable signal transfer function; and quantizing an output of the second summation circuit to generate an output of the DSM, wherein the output of the DSM is feedback as the error feedback signal to be subtracted from the input signal, and wherein the tunable signal transfer function is dynamically tuned to allow selecting and tuning a center frequency and a bandwidth of the DSM.

In some embodiments, the disclosed invention is an antenna array that includes a plurality of antennas; and a beamforming circuit including a parameterizable bandpass delta-sigma modulator (DSM). The DSM includes: a first summation circuit coupled to an input signal for subtracting an error feedback signal from the input signal; a tunable signal transfer function coupled to the first summation circuit for setting a desired pole in a frequency response of the DSM; a second summation circuit coupled to the tunable signal transfer function for adding a noise transfer function to an output of the tunable signal transfer function; and a quantizer coupled to the second summation circuit for quantizing an output of the second summation circuit to generate an output of the DSM, wherein the output of the DSM is used as feedback to the first summation circuit as the error feedback signal, and wherein the tunable signal transfer function is dynamically tuned to allow selecting and tuning a center frequency and a bandwidth of the DSM.

In some embodiments, the DSM further includes a digital-to-analog converter (DAC) for converting the output of the DSM to an analog signal and inputting the analog signal to the first summation circuit as the error feedback signal. In some embodiments, the tunable signal transfer function may be implements as a finite impulse response (FIR) filter. In some embodiments, the tunable signal transfer function is dynamically tuned by placing a pole of the tunable signal transfer function at the center frequency. The center frequency of the DSM may be tuned by placing a zero of the noise transfer function at the center frequency.

BRIEF DESCRIPTION OF THE DRAWINGS

These and other features, aspects, and advantages of the present invention will become better understood with regard to the following description, appended claims, and accompanying drawings.

DETAILED DESCRIPTION

In some embodiments, the disclosed invention is a circuit and method that generates a parameterizable bandpass waveform that has a variable center frequency and bandwidth. In some embodiments, this is accomplished by a tunable noise-transfer-function and tunable signal-transfer-function within a delta-sigma modulation technique. This way, the delta-sigma modulator is tuned to an arbitrary center frequency and the bandwidth of the delta-sigma modulator is also tuned. The center frequency of the delta-sigma "notch" is tuned by updating coefficients such as to place the zero of the noise transfer function at that center frequency, which is described in more detail with respect to FIG. 4. The bandwidth is determined in part by the oversampling ratio, defined as the clock sampling rate divided by the desired instantaneous bandwidth. This oversampling ratio sets a maximum dynamic range for a given bandwidth.

In some embodiments, the disclosed invention generates arbitrary waveforms from a monobit transmitter. The monobit transmitter circuit operates as a switch, similarly to a Class D or Class E amplifier. Accordingly, if a high bandgap and high power technology, such as Gallium Nitride, were used to implement the monobit transmitter, the resulting circuit can serve as both a monobit DAC and a power amplifier.

This approach eliminates the high cost of element-level direct RF digitization and provides a software-defined method to allow the center frequency, bandwidth, and dynamic range of a transmit waveform to be changed in real-time and the feedback coefficient values of the signal and noise transfer functions to be optimally determined. This approach is also suitable for field-programmable gate arrays (FPGAs) and for application-specific integrated circuit (ASIC) implementations.

Figure 3:
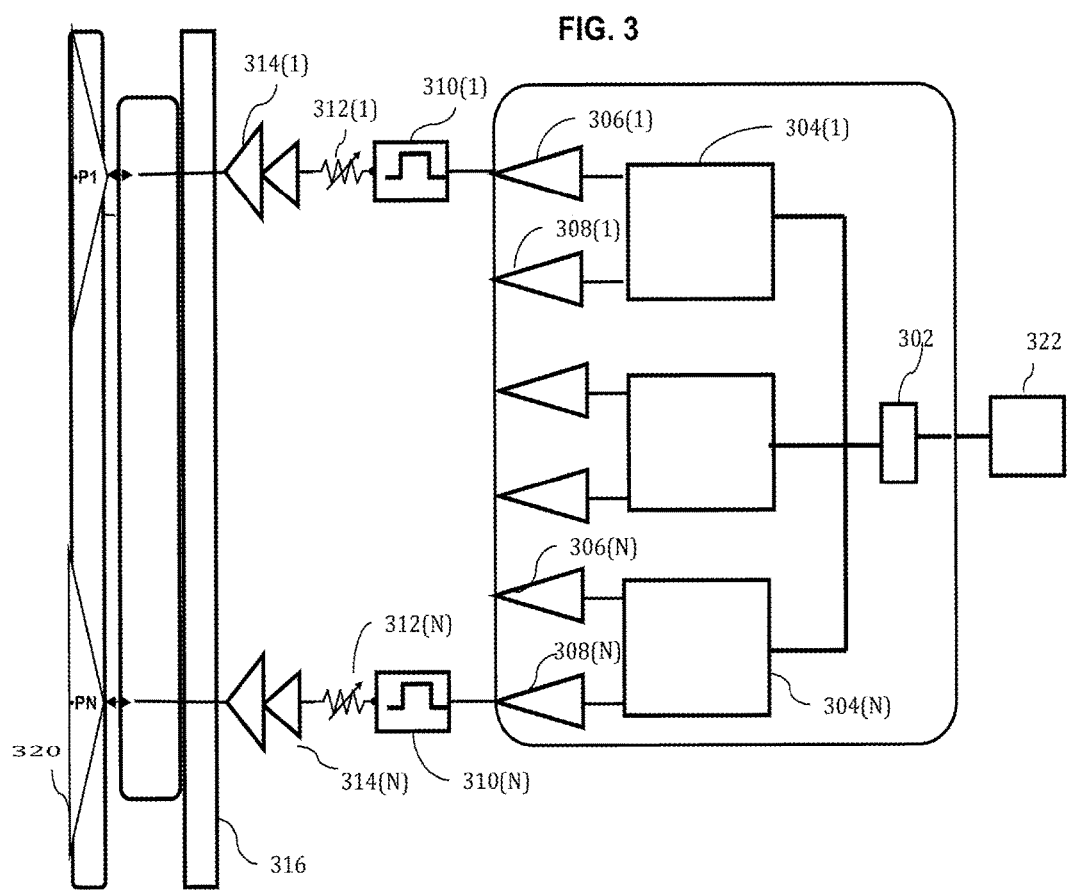
FIG. 3 is a simplified block diagram of an antenna array with parameterizable beamforming circuits, according to some embodiments of the disclosed invention.

FIG. 3 is a simplified block diagram of a direct digital to RF transmit antenna array with parameterizable beamforming circuits, according to some embodiments of the disclosed invention. The antenna array may be an Electronically Scanned Array (ESA) antenna utilized by a radar system. As shown, a digital version of the delta-sigma modulator (DSM) 302 generates the IIQ sequence that drives a plurality of beamforming modules or circuits 304(1) to 304(N), which are digital phase shifters or digital true time delay circuits some embodiments. Each beamforming module or circuit 304(1) to 304(N) directs the DSM generated signal to a desired phase corresponding to a desired azimuth/elevation angle in space. In this example, each beam forming module 304 drives a pair of DACs 306 and 308. Each DAC 306 and 308 converts the digital output from a respective beam forming module 304 and converts it to an analog signal, which is then filtered by respective bandpass filters 310. In some exemplary embodiments of FIG. 3, a monobit phased array transmitter includes the DACs 306 and 308 (which are also monobit DACs), which may be implemented by a monobit or a single bit DAC. The DACs 306 and 308 are used for horizontal and vertical polarizations, respectively. The DSM 302 may be implemented digitally in an FPGA or ASIC.

In digital beamforming applications, often multiple carriers are required to be transmitted per element in the array. In some cases, two different signal types such as a radar signal and a communications signal are combined and transmitted per element. The bandpass filters 310 may be used to separate the two or more carriers or signals such that they can be amplified through a power amplifier without intermodulation distortion and with correct amplitude and phase. In some cases, the gain of each of the outputs of the bandpass filters 310(1) to 310(N) are controlled by a respective Automatic Gain Controller (AGC) 312(1) to 312(N) to allow optimal input power into the power amplifiers 314(1) to 314(N).

The output of each AGC 312 is input to a respective power amplifiers 314. Each of the power amplifiers 314(1) to 314(N) filters its input signal (output from a respective AGC 312) into two or more frequency bands, using for example, a programmable analog finite impulse response (FIR) filter. The frequency bands are then fed into a cold plate 316 of the antenna array.

Figure 1:
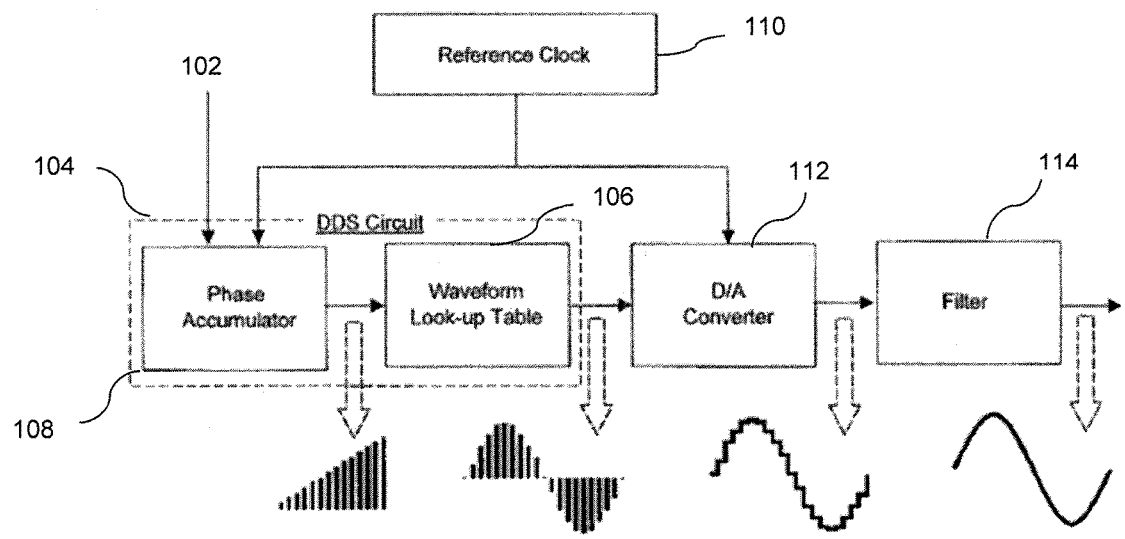
FIG. 1 shows a diagram of a conventional antenna array.
Figure 2:
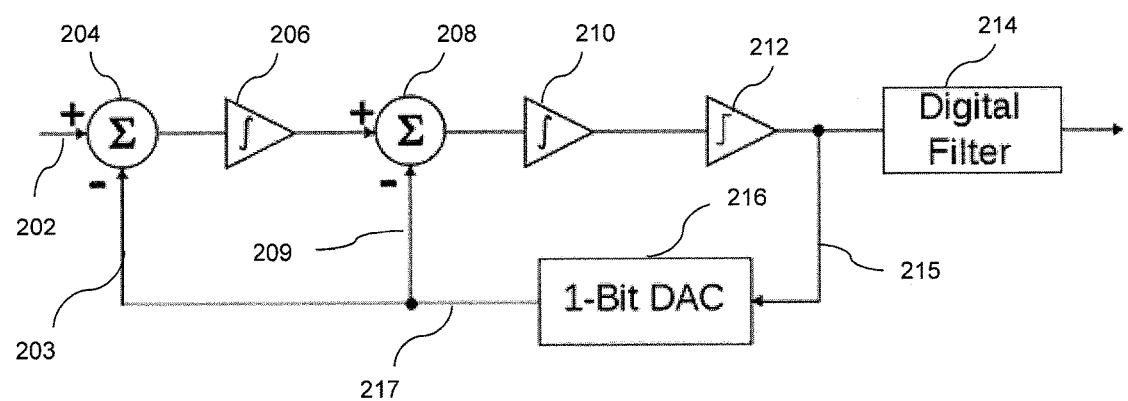
FIG. 2 illustrates a typical delta-sigma modulator.

The cold plate 316 then directs each signal through a radar aperture 320. An arbitrary waveform generator 322 provides the input waveform to the delta sigma modulator 302. In some embodiments, the arbitrary waveform generator may be included on the same FPGA device or ASIC, as the DSM 302. In some embodiments, the arbitrary waveform is generated from a memory or from another computing device. Waveform synthesis, such as that shown in FIG. 1, is implemented in digital domain in blocks 322 and 302. Time delay or phase shifts may digitally be applied, in blocks 304(1)-304(N) and transmitted out of the array of DAC 306 and 308, where 306 may be a horizontally polarized path and 308 may be a vertically polarized path. The DACs 306 and 308 are typically multi-bits and include track-and-hold circuits, capacitors, comparators and resistors to send/receive data from other processing circuits, for example, one or more field-programmable gate arrays (FPGAs).

In a transmit mode shown in FIG. 3, the delta-sigma modulated waveform is implemented digitally in the DSM 302. The waveform is then converted to RF by a DAC and transmitted through the rest of the RF chain, where a bandpass filter 310 is chosen based on the application's frequency requirements. For example, if a 4 GHz signal is needed for the application, then a bandpass filter centered around 4 GHz is chosen for 310. A variable gain is implemented by a variable gain/attenuator module, such as AGC 312 and a power amplifier 314.

Figure 4:
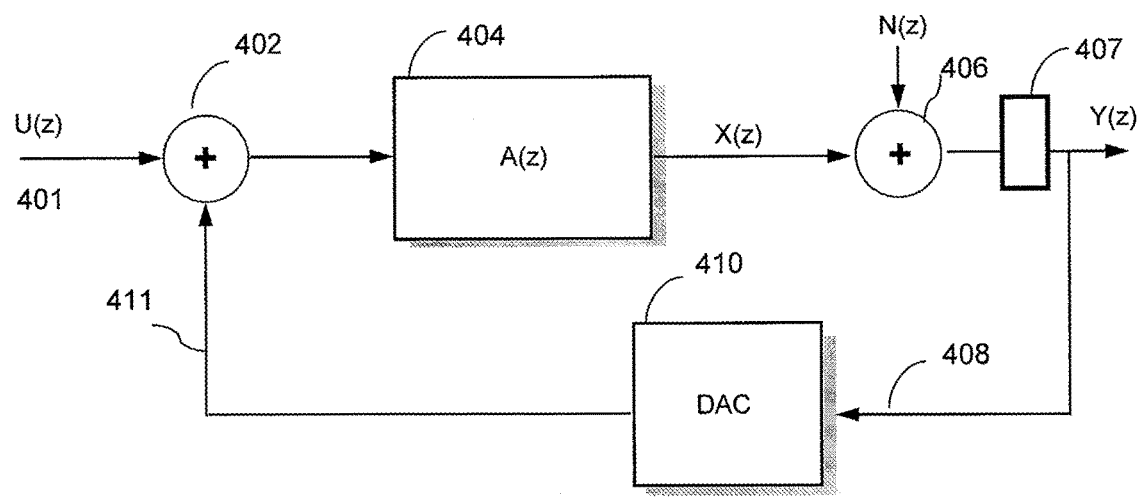
FIG. 4 is an exemplary block diagram of a tunable delta-sigma modulator, according to some embodiments of the disclosed invention.

For a given oversampling ratio, the bandwidth is determined by the number of zeros and number of poles and how close together these poles and zeros appear in the signal transfer function, described in more detail in FIG. 4. More poles and zeros (i.e., higher order signal transfer function) equate to a larger total instantaneous bandwidth. Spacing poles and zeros further apart in frequency results in amplitude variation between the poles and zeros. Typically, a flat amplitude in the spectrum is desired and therefore the poles and zeros are desirable to be sufficiently close together to result in a flat amplitude (e.g., within 1 dB to 3 dB).

For example, in some embodiments, the poles and zeros of the signal transfer function are chosen such that the overall frequency response is stable, meets the center frequency and bandwidth requirement, and does not introduce any more noise to the system. The DSM shapes the noise power out of band such that a high dynamic range trench is created. The desired signal of interest remains centered in this ditch. In some embodiments, to explicitly determine the poles and zeros on the complex plane, these parameters are initialized with "good" guess as to what they should be, for example, one pole at the desired center frequency. To extend the bandwidth, more poles are included near the initially placed pole. Zeros are similarly calculated. In some embodiments, Monte Carlo analysis is used to test whether a suitable choice exists for the poles and zeros satisfying the DSM requirements, however, other known search techniques may also be used. In some embodiments, the convergence criteria for the search includes the above-mentioned system requirements and may also include maximization of the SNR in the ditch that is created.

The disclosed invention produces a pulse density modulated bandpass waveform that is frequency agile (e.g., variable center frequency, bandwidth, dynamic range and Spurious-free dynamic range (SFDR)). This waveform does not need to be up-converted prior to connecting to an antenna and therefore eliminating the traditional RF up-conversion circuits.

FIG. 4 is an exemplary block diagram of a tunable delta-sigma modulator (DSM), according to some embodiments of the disclosed invention. The DSM may be the DSM 302 depicted in FIG. 3. As shown, a (first) summation circuit 402 subtracts an error feedback signal from the input signal U(z) 401. A signal transfer function A(z) is applied in block 404. This signal transfer function A(z) is designed to set the desired poles in the frequency transfer function's pole-zero diagram. In some embodiments, this may be implemented with an FIR filter. A noise transfer function N(z) is added to the output signal X(z) of the block 404 in a (second) summation circuit 406.

The noise transfer function and the signal transfer function are used to analyze the overall transfer function of the beamforming circuit since the frequency analysis focuses on the overall transfer function. Poles are tuned by the signal transfer function in which it is assumed that there is ideal quantization. Zeros are tuned by the noise transfer function in which it is assumed that there is some form of quantization error (e.g., a non-infinite quantizer resolution). Consequently, the noise and signal transfer functions help in the analysis of where the poles and zeros are placed on the complex plane.

Quantization is implied in this diagram. The noise transfer function N(z) accounts for the additive noise in the system, which is used to linearize the signal. Otherwise, one can assume there is no additive noise error, i.e., N(z)=0. After quantization, the quantized signal 408 is fed back to a DAC 410. In a transmit mode, the feedback quantized signal 408 is a digital signal and therefore no DAC is needed. In this case, the digital feedback quantized signal 408 is feedback through signal path 411 to the summation circuit 406, without any DAC. When in a receive mode, the input signal U(z) 401 is input to the summation circuit 402, as an analog signal. The signal transfer function A(z) 404 is applied to the output of the summation circuit 402 and the noise transfer function N(z) is added in the summation circuit 406. The output of the summation circuit 406 is then quantized with a quantizer 407, for example, an ADC, into the digital domain and the feedback signal 408 is converted back to an analog signal by the DAC 410 to allow feedback in the analog domain.

The equations below represent the mathematical formulation of some embodiments of the transfer function A(z) 404. A(z) is the transfer function of an Infinite impulse response (IIR) filter implemented where the poles and zeros of this IIR filter follow the standard IIR filter theory that is known in the art. For example, an IIR filter that is often used in the art is an integrator where the input to the IIR is fed to a summer circuit, and the output of the summer circuit is fed back into the summer with some delay. A digital first order IIR integrator equates to y[n]=y[n−1]+T*x[n], where T is the sampling period. If we implemented this first order IIR integrator in our block diagram 404, then A(z), the transfer function of 404, is given by the Z-transform of the output divided by the input A(z)=Y(z)/X(z). Solving for the first order IIR integrator, we obtain $$A(z) = T\left(\frac{1}{1-z^{-1}}\right).$$

The numerator of the transfer function represents all the zeros and the denominator of the transfer function represents all the zeros. In general $$A(z) = \frac{\prod(1-z_k z^{-1})}{\prod(1-p_k z^{-1})}$$

where $z_k$ is the $k^{th}$ zero, and $p_k$ is the $k^{th}$ pole, all corresponding to a physical IIR circuit.

As shown in FIG. 4, U(z) is the input to the modulator, Y(z) is the quantized output, N(z) is the noise added to the modulator and X(z) is an intermediate value that is the output of the signal transfer function A(z) 404. More specifically, the output Y(z) is the summation of the intermediate value X(z) and the noise N(z), or Y(z)=N(z)+X(z). X(z) is the result of the feedback loop Y(z−1), being subtracted from the input signal U(z) 401. Subsequently, U(z)−Y(z−1) is multiplied by the signal transfer function A(z) to obtain the intermediate value X(z)=(U(z)−Y(z−1))A(z). It is assumed that successive output values are in general similar, in other words, Y(z)=Y(z−1). Summarizing these equations produces:

$$Y(z)=N(z)+X(z)=N(z)+(U(z)-Y(z))A(z) \tag{1}$$

Next, the signal transfer function A(z) 404 and noise transfer function N(z) are defined. That is, by shaping the signal and noise transfer functions A(z) and N(z), the signal quality of the delta-sigma modulator can be configured to allow selecting and tuning the center frequency and bandwidth of the output Y(z) of the delta-sigma modulator.

The signal transfer function A(z) 404 may be identified as the quotient of the output and the input signals or Y(z)/U(z), and expressed in the equations below. Assuming a linear system and where N(z)=0, then:

$$Y(z)=(U(z)-Y(z))A(z)=A(z)U(z)-A(z)Y(z), \text{hence:}$$

$$Y(z)=(A(z)U(z))/(1+A(z)) \text{ and } Y(z)/U(z)=A(z)/(1+A(z)) \tag{2}$$

Similarly, the noise transfer function N(z) can be identified as the quotient of the output Y(z) with the noise function N(z) or Y(z)/N(z)Y(z)/N(z), and is expressed below. Assuming a linear system and momentarily where U(z)=0, and Y(z−1)=Y(z) then:

$$Y(z)=N(z)-A(z)Y(z),$$

$$Y(z)+A(z)Y(z)=N(z),$$

$$Y(z)=N(z)/(1+A(z)), \text{ and}$$

$$Y(z)/N(z)=1/(1+A(z)) \tag{3}$$

The signal and noise transfer functions are designed to tune the center frequency and bandwidth of the delta-sigma signal by tuning the poles and zeros of each of the transfer functions. This allows tuning the signal quality at a desired value. A zero (i.e., a notch) in the noise transfer function at the frequency of the signal of interest represents a notch in the noise at that frequency, which allows obtaining good dynamic range, signal to noise ratio, and signal quality at that frequency. At the same time, the signal transfer function A(z) 404 needs to be tuned/configured to pass the signal of interest, or in other words, have a "pole" at the frequency of interest. A pole in the signal transfer function A(z) 404 means the signal is passed through the delta-sigma modulator with high power. Accordingly, a pole in the signal transfer function A(z) 404 at a frequency and a zero in the noise transfer function N(z) at that same frequency creates a high dynamic range, high signal to noise ratio, and high signal quality at that frequency. In some embodiments, the tuning is performed on the fly, where coefficients are calculated or precomputed, for example, for changing center frequencies, instantaneous bandwidth (IBW), and the like.

Frequency diversity is demonstrated by manipulating the signal and noise transfer functions A(z) and N(z) (i.e. poles/zeros) in the Z-domain. The order of the delta-sigma modulator defines the number of poles and zeros. For example, a second order system works well for reasonably narrowband cases because the second order signal and noise transfer functions, as described in FIG. 4, provide for one complex pole and one complex zero that are sufficient to provide a good signal-to-noise ratio (SNR) at the frequency location of the pole. However, to improve the bandwidth, more poles in the signal transfer function A(z) 404 are needed.

Referring back to FIG. 4, creating more poles in the signal transfer function A(z) 404 involves creating a more complex A(z) function where multiple feedback loops are implemented within the A(z) function. For example, since A(z) is a summation of coefficients and delays, the signal transfer function A(z) 404 can be separated into sub-functions such that the summation of sub-A blocks, A1(z) (first tunable signal transfer function) and A2(z) (second tunable signal transfer function) is A(z)=A1(z)+A2(z). That is, A(z) 404 depicted in FIG. 4 is now divided into two sub-blocks, A1(z) and A2(z). In this case, the signal feedback path 411 can be fed to the input of both A1(z) and A2(z).

In some embodiments, the high order bandpass tunable delta-sigma modulator is implemented utilizing a high order A(z) supporting tunable center frequency, dynamic range, and bandwidth of the signals. In a higher order modulator, one can solve for 4 poles, p1, p2, p3, and p4, using a complex exponential form for the poles. Solving for the coefficients in each of the poles (which make up A(z)), one example of useful coefficients are:

$r=0.998$ $p1=r*\exp(j*(45-4.8109)*pi/180);$ $p2=\text{conj}(p1)$ $p3=r*\exp(j*(45+4.8109)*pi/180);$ $p4=\text{conj}(p3);$ where the p variables are complex coefficients that define the position of the poles and zeros in the frequency space. This yields: 1/A(z), where A(z)=1-2.812825 $z^{-1}$+ 3.955992 $z^{-2}$−2.8015850 $z^{-3}$+0.99202396 $z^{4}$ In general, the signal transfer function Y(z)/U(z)=A(z) may be expressed in this form:

$$( ) = \frac{1}{1 - \sum_{=1}^{}} \qquad (4)$$

where the a variables are the complex coefficients in which the linear combination through the summation defines A(z). This equation (4) describes an arbitrary order where N is the order.

Figure 5:
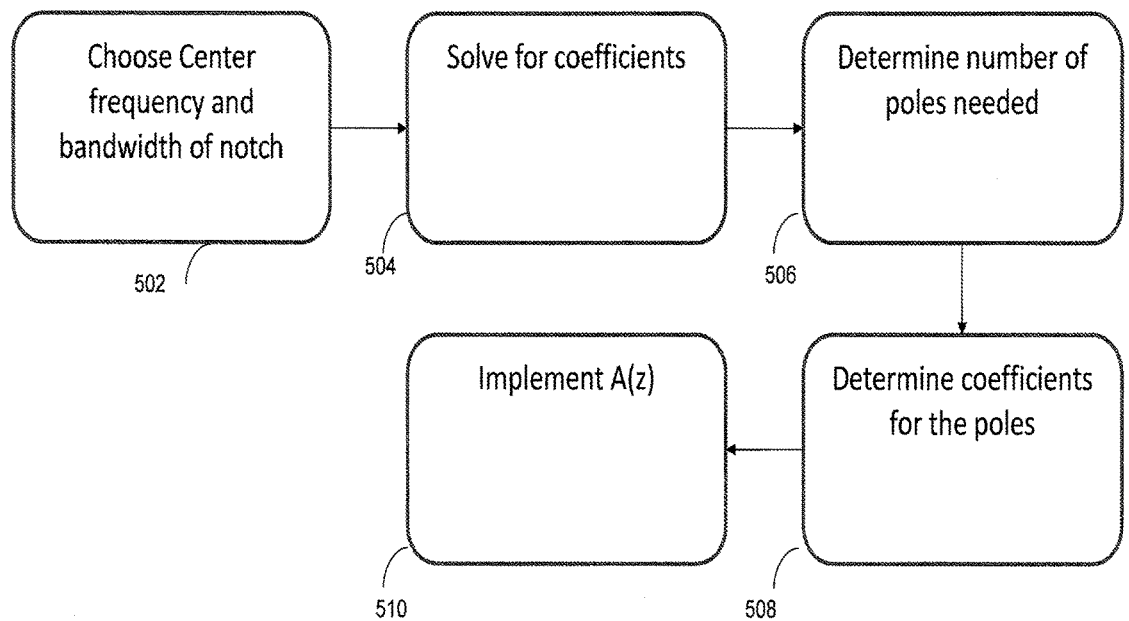
FIG. 5 is a simplified process flow diagram for manipulating the transfer function of a tunable delta-sigma modulator, according to some embodiments of the disclosed invention.

FIG. 5 is a simplified process flow diagram for manipulating the signal transfer function of a tunable delta-sigma modulator, according to some embodiments of the disclosed invention. This process is performed during the design phase and once completed the resulting IIR circuit may be implemented in the DSM 302 of FIG. 3. As shown in block 502, a desired center frequency and bandwidth of a notch are selected by the user, as part of system parameters for dynamic range, signal to noise ratio and signal quality, based on system/design requirements representing the hardware configuration. In block 504, the coefficients that place the zero(s) of the noise transfer function at the selected frequency are obtained, based on Equation (4) by an IIR circuit according to transfer function theory known in the art, such as the circuit depicted in FIG. 6, and in some embodiments, implementing that circuit in the DSM 302 of FIG. 3. In block 506, the number of poles needed to achieve the desired bandwidth is determined. In some embodiments, the bandwidth is provided to the system from an outside source, for example, from apriori knowledge or a detection logic. Once the coefficients are determined, standard signal processing techniques (e.g. Z-transform) generate the transfer function, A(z).

In block 508, the coefficients for the poles that maximize SNR or maximize bandwidth are determined, for example, by a Monte Carlo simulation. The signal transfer function A(z) is then determined using the coefficient, in block 510.

The process flow diagram in FIG. 5 illustrates that for a given desired center frequency, the coefficients to put the zero(s) of the signal transfer function at the given center frequency are determined. Then, based on the desired bandwidth, the number of poles and coefficients for the poles are determined by running a Monte Carlo simulation and settling on the values that maximize the SNR. With these coefficients determined, the signal transfer function A(z) is implemented. The noise transfer function N(z) is a modeling technique to remove the quantization error effect. For example, if noise is added to the system that matches the response of the quantization noise, then it can be concluded that there is noise error but no quantization error.

Figure 6:
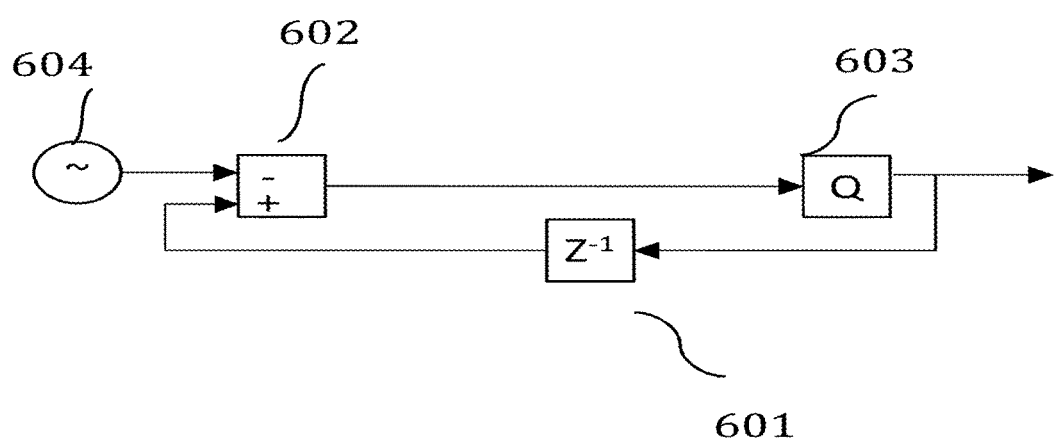
FIG. 6 is a block diagram of an Infinite impulse response (IIR) circuit and a first order integrator circuit, according to some embodiments of the disclosed invention.

FIG. 6 is a block diagram of an Infinite impulse response (IIR) circuit and a first order integrator circuit, according to some embodiments of the disclosed invention. In some embodiments, where step 506 of FIG. 5 produces a single pole and no zeros needed, and the coefficients produced in step 510 produce a coefficient of 1, the transfer function A(z) is implemented as $$A(z) = T\left(\frac{1}{1-z^{-1}}\right),$$

which can be implemented by the circuit of FIG. 6 in step 508 of FIG. 5. As shown in FIG. 6, an incoming waveform signal 604, for example, coming from the arbitrary waveform generator 322 in FIG. 3, is fed to the input of the delta signal modulator 302 in FIG. 3. In some embodiments, the integrator 602 is a summer. After quantizing the signal with quantizer 603, which in some embodiments Q is a monobit quantizer and in others a multi-bit quantizer, the signal is fed back through a delay path 601. This circuit implements the $$A(z) = T\left(\frac{1}{1-z^{-1}}\right)$$

in the process flow diagram of FIG. 5.

This way, the disclosed invention substantially improves the Spurious-free dynamic range (SFDR) of the wideband signals. SFDR is defined as the ratio of the RMS value of the carrier wave (maximum signal component) at the input of the ADC or output of DAC to the RMS value of the next largest noise or harmonic distortion component at its output.

It will be recognized by those skilled in the art that various modifications may be made to the illustrated and other embodiments of the invention described above, without departing from the broad inventive step thereof. It will be understood therefore that the invention is not limited to the particular embodiments or arrangements disclosed, but is rather intended to cover any changes, adaptations or modifications which are within the scope of the invention as defined by the appended claims.

The invention claimed is:

1. A parameterizable bandpass delta-sigma modulator (DSM) comprising:
    a first summation circuit coupled to an input signal for subtracting an error feedback signal from the input signal;
    a tunable signal transfer function coupled to the first summation circuit for setting a desired pole in a frequency response of the DSM;
    a second summation circuit coupled to the tunable signal transfer function at a first input port and to a noise transfer function at a second input port for adding the noise transfer function to an output of the tunable signal transfer function; and
    a quantizer coupled to the second summation circuit for quantizing an output of the second summation circuit that includes the noise transfer function and the output of the tunable signal transfer function to generate an output of the DSM, wherein the output of the DSM is used as feedback to the first summation circuit as the error feedback signal, and wherein the tunable signal transfer function is dynamically tuned to allow selecting and tuning a center frequency and a bandwidth of the DSM, and wherein the center frequency of the DSM is tuned by placing a zero of the noise transfer function at the center frequency.

2. The parameterizable DSM of claim 1, further comprising a digital-to-analog converter (DAC) for converting the output of the DSM to an analog signal and inputting the analog signal to the first summation circuit as the error feedback signal.

3. The parameterizable DSM of claim 1, wherein the tunable signal transfer function is implemented as a finite impulse response (FIR) filter.

4. The parameterizable DSM of claim 1, wherein the tunable signal transfer function is dynamically tuned by placing a pole of the tunable signal transfer function at the center frequency.

5. The parameterizable DSM of claim 1, wherein the bandwidth of the DSM is tuned by an oversampling ratio, defined as a sampling rate divided by a desired instantaneous bandwidth, and wherein the oversampling ratio sets a maximum dynamic range for the desired instantaneous bandwidth.

6. The parameterizable DSM of claim 1 implemented in a Gallium Nitride circuit.

7. The parameterizable DSM of claim 1, further comprising a second tunable signal transfer function for setting a second desired pole in the frequency response of the DSM to increase an order of the DSM.

8. The parameterizable DSM of claim 4, wherein coefficients for the pole of the tunable signal transfer function to maximize signal-to-noise ratio (SNR) or maximize the bandwidth are determined by a Monte Carlo simulation.

9. The parameterizable DSM of claim 8, wherein the tunable signal transfer function is tuned using the coefficients.

10. A method for tuning a delta-sigma modulator (DSM), the method comprising:
    receiving an input signal;
    subtracting an error feedback signal from the input signal;
    setting a desired pole in a tunable signal transfer function of the DSM;
    adding a noise transfer function to an output of the tunable signal transfer function to generate a combined signal that includes an output of the signal transfer function summed with the noise transfer function; and
    quantizing the combined signal that includes an output of the signal transfer function summed with the noise transfer function to generate an output of the DSM, wherein the output of the DSM is feedback as the error feedback signal to be subtracted from the input signal, and wherein the tunable signal transfer function is dynamically tuned to allow selecting and tuning a center frequency and a bandwidth of the DSM, and wherein the center frequency of the DSM is tuned by placing a zero of the noise transfer function at the center frequency.

11. The method of claim 10, further comprising converting the output of the DSM to an analog signal and inputting the analog signal to the first summation circuit as the error feedback signal.

12. The method of claim 10, wherein the tunable signal transfer function is dynamically tuned by placing a pole of the tunable signal transfer function at the center frequency.

13. The method of claim 10, wherein the bandwidth of the DSM is tuned by an oversampling ratio, defined as a sampling rate divided by a desired instantaneous bandwidth, and wherein the oversampling ratio sets a maximum dynamic range for the desired instantaneous bandwidth.

14. An antenna array comprising: a plurality of antennas; and
    a beamforming circuit including a parameterizable bandpass delta-sigma modulator (DSM) comprising:
        a first summation circuit coupled to an input signal for subtracting an error feedback signal from the input signal;
        a tunable signal transfer function coupled to the first summation circuit for setting a desired pole in a frequency response of the DSM;
        a second summation circuit coupled to the tunable signal transfer function at a first input port and to a noise transfer function at a second input port for adding the noise transfer function to an output of the tunable signal transfer function; and
        a quantizer coupled to the second summation circuit for quantizing an output of the second summation circuit that includes the noise transfer function and the output of the tunable signal transfer function to generate an output of the DSM, wherein the output of the DSM is used as feedback to the first summation circuit as the error feedback signal, and wherein the tunable signal transfer function is dynamically tuned to allow selecting and tuning a center frequency and a bandwidth of the DSM, and wherein the center frequency of the DSM is tuned by placing a zero of the noise transfer function at the center frequency.

15. The antenna array of claim 14, wherein the parameterizable DSM further comprises a digital-to-analog converter (DAC) for converting the output of the DSM to an analog signal and inputting the analog signal to the first summation circuit as the error feedback signal.

16. The antenna array of claim 15, wherein the tunable signal transfer function is implemented as a finite impulse response (FIR) filter.

17. The antenna array of claim 14, wherein the tunable signal transfer function is dynamically tuned by placing a pole of the tunable signal transfer function at the center frequency.

* * * * *